Oct. 20, 1959 J. V. FRANCK 2,909,731

CAVITY EXCITATION CIRCUIT

Filed Oct. 3, 1956 2 Sheets-Sheet 1

INVENTOR.
JACK V. FRANCK

BY

Roland A. Anderson

ATTORNEY.

Oct. 20, 1959 J. V. FRANCK 2,909,731

CAVITY EXCITATION CIRCUIT

Filed Oct. 3, 1956 2 Sheets-Sheet 2

INVENTOR.
JACK V. FRANCK

BY

Roland A. Anderson
ATTORNEY.

United States Patent Office 2,909,731
Patented Oct. 20, 1959

2,909,731

CAVITY EXCITATION CIRCUIT

Jack V. Franck, Lafayette, Calif., assignor to the United States of America as represented by the United States Atomic Energy Commission Application October 3, 1956, Serial No. 613,798

4 Claims. (Cl. 331—9)

The present invention relates to an electronic circuit for excitation of a resonant cavity and more particularly to an oscillator circuit with stabilizing means for accurately controlling mode and frequency of operation.

When utilizing high frequency oscillators for exciting resonant cavities, it is frequently necessary to provide close control over the oscillator output frequency. Such control is necessitated when a particular mode or pattern of electromagnetic field is required in the resonant cavity. Generally, there are several different modes which may build up in a particular resonant cavity, each mode corresponding to a discrete frequency. Several such frequencies may be present within a few percent of a desired frequency. Thus, it is necessary that special stabilizing means be utilized to closely regulate the oscillator frequency.

The commonly used method has been to maintain a very close control over the oscillator frequency by the inclusion of various impedances between the oscillator output and the coupling loop used for inserting the exciting energy into a resonant cavity. Such impedances are arranged so as to obtain some degree of discrimination against all but the desired frequency and control the loading on the oscillator to maintain the desired operating frequency. While such a system is operable, considerable power loss is encountered in the frequency determining impedances and close adjustment is required to insure operation at the desired frequency.

The present invention eliminates such power consuming impedances and thereby increases the efficiency of the oscillator system. The oscillator is maintained at approximately the desired frequency by conventional grid circuit tuning. Energy from the oscillator is coupled into the resonant cavity by conventional loop means. A feedback system is arranged to couple a signal out of the resonant cavity only at the desired frequency, which signal is applied to the oscillator to stabilize it precisely. The resonant cavity and the feedback system act in effect as a highly selective tuned circuit. In the feedback circuit there is provided a control for the amplitude of the feedback signal.

The particular embodiment of the invention described here was developed for use with a linear accelerator for nuclear particles. In a linear accelerator control over the mode is quite important, since there is only one configuration of the electric field at which satisfactory particle acceleration occurs such field being the 0, 1, 0 mode as defined with respect to the magnetic field.

It is therefore an object of the present invention to provide an improved frequency control for a cavity resonator oscillator.

It is another object to decrease the number of high frequency power tubes necessary for exciting a cavity resonator.

It is yet another object to provide a feedback loop for stabilizing oscillations at a selected mode in a resonant cavity.

It is still another object to provide an improved means for controlling the phase and amplitude of a feedback signal.

The invention, both as to its organization and method of operation, together with further objects and advantages thereof, will best be understood by reference to the following specification taken in conjunction with the accompanying drawings, in which.

Figure 1:
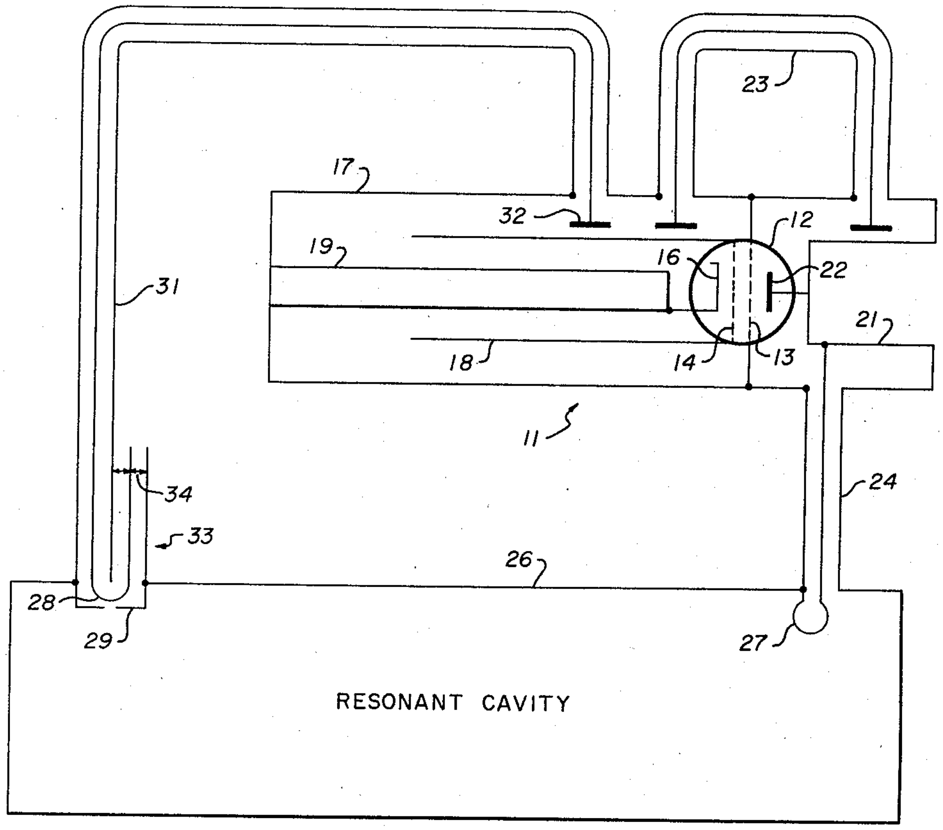
Figure 1 is a schematic drawing of an oscillator, cavity and feedback system according to the invention.

Referring now to the drawing, and more particularly to Fig. 1, there is shown an oscillator assembly 11 utilizing a power tetrode tube 12 in a circuit equivalent to a two stage amplifier. The first amplifier stage comprising the oscillator section uses a screen grid 13 as an anode in conjunction with a control grid 14 and a cathode 16. The screen grid 13 is connected to an outside cylindrical housing 17 which is the outer conductor for a tuned line. The control grid 14 is connected to a cylindrical control grid element 18 disposed within the housing 17. A cathode element 19 connected to the cathode 16 forms the inner conductor of a resonant line. In this instance the elements are arranged so that in effect a Colpitts oscillator is formed. For such a circuit the length of the cathode element 19 is preferably equal to three-fourths of a wavelength at the operating frequency while the grid element 18 is one-half wavelength long.

A second amplifier is formed by utilizing the anode circuit of the tube, the circuit being coupled to the oscillator circuit by electron-coupling. A cylindrical inner anode conductor 21 of a tuned transmission line is connected from an anode 22 in the tube 12 to the outside housing 17, forming a quarter wavelength tuned anode circuit. A neutralization line 23 is capacitively coupled to the inner anode conductor 21 and the control grid element 18 for neutralizing the anode 22 to control grid 14 capacity so that the oscillator circuit is unaffected by voltage in the output or anode circuit.

Power is passed from the anode circuit through an output transmission line 24 connected to the inner anode conductor 21. A coupling loop 27 couples power from the terminal end of the output line 24 to a resonant cavity 26. The resonant cavity 26 readily builds up a field at any one of several discrete adjacent frequencies, only one of which is desired. The inherent frequency instability of the oscillator prevents delivery of appreciable power to the highly selective load at the desired frequency of oscillation, thus the tuning can only be approximately set by the dimensions of the control grid element 18 and cathode element 19. For precise control of the frequency, a highly frequency-selective feedback loop is provided.

For each of the discrete frequencies for which an electromagnetic field will form in the resonant cavity 26, the field assumes a different configuration or mode. A feedback loop 28 is placed in a location where it will intercept a portion of the magnetic field only when the desired mode is present. A pair of shield electrodes 29 cover the end of the loop 28 so that the electric field in the cavity 26 does not create any feedback signal. A short gap between the ends of the shields 29 allows the magnetic field to couple to the loop. The feedback loop 28 is then located at a point where it is at a magnetic field null point for all modes except the one desired. Actually, it will probably not be possible to find a point where no other mode has a magnetic field, but the frequency creating such modes will generally be far enough removed from the desired frequency so as to have no important effect on the oscillator since the tuning of the oscillator will discriminate against such removed frequencies.

Potentials induced in the feedback loop 28 are coupled through a coaxial feedback line 31 to a feedback electrode 32 located adjacent to the control grid element 18 whereby capacity coupling injects a feedback signal into the oscillator. The length of the feedback line 31 between the feedback loop 28 and the feedback electrode 32 is made equal to a multiple of a half wavelength. While capacitive feedback coupling is indicated by the feedback electrode 32, inductive or resistive coupling can likewise be utilized. With capactive coupling the oscillator is tuned slightly below the desired frequency while with inductive coupling the oscillator is tuned above. Resistance coupling provides a short range for frequency stabilization on both sides of the desired frequency, but the output power is more constant over such range than is obtained with inductive or capacitive coupling.

The amplitude of the feedback signal is readily adjusted by use of a quarter wavelength stub 33 wherein the inner conductor is adjustably shorted to the outer conductor by a stub tuning element 34. If the tuning element 34 is set so the tuning stub 33 is exactly a quarter wavelength long, no signal is applied to the feedback electrode 32 since a voltage maxima point will be in the center of the feedback loop 28 exposed to the cavity magnetic field and the signal from the two halves of the loop will cancel. As the stub tuning element 34 is adjusted to alter the electrical wavelength of the stub 33, complete concellation of signal no longer occurs and a signal is obtained at the feedback electrode 32. The phase of the feedback signals may be shifted 180° dependent upon whether the tuning element 34 is disposed more or less than a quarter wavelength from the center of the feedback loop 28.

Figure 2:
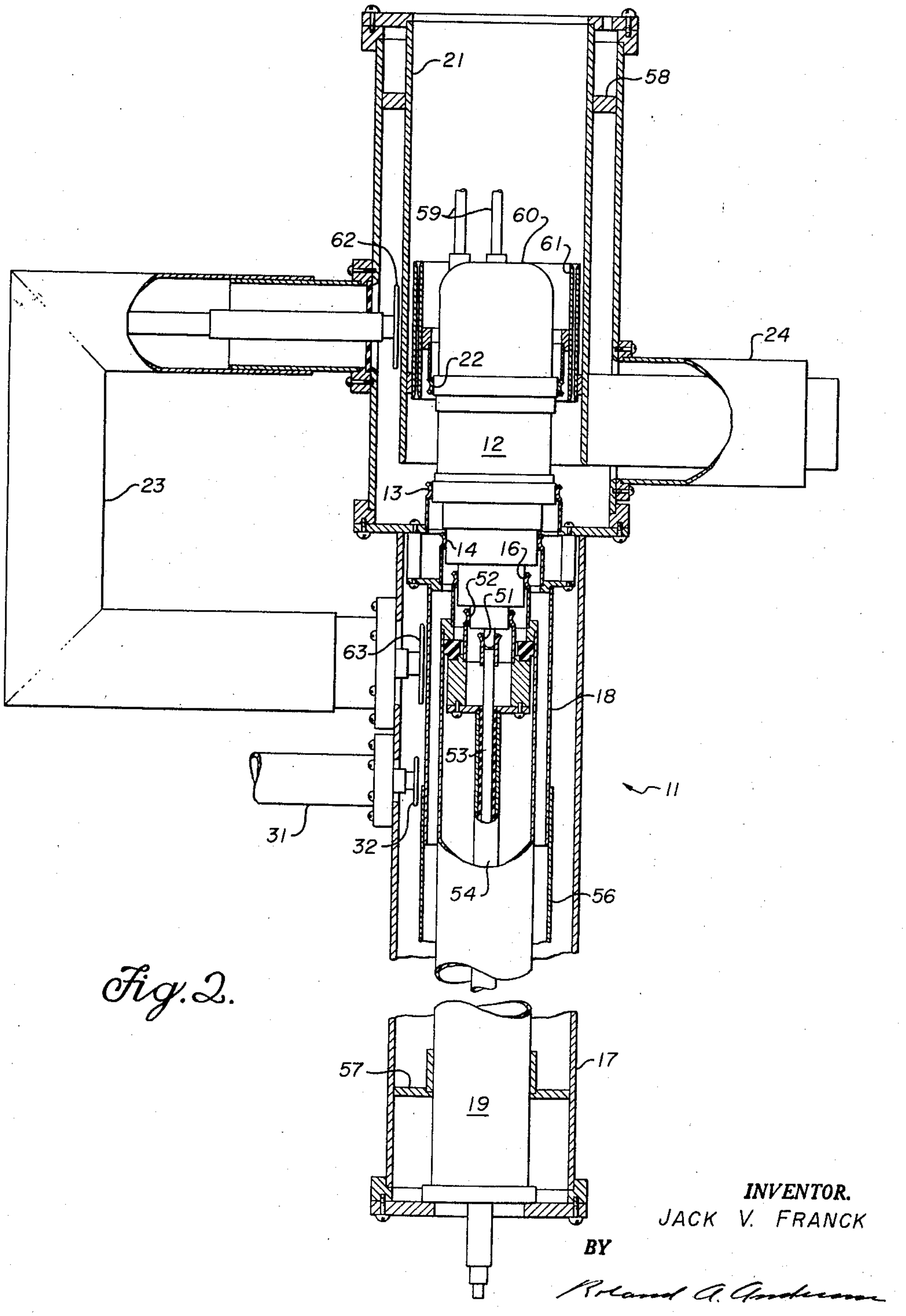
Figure 2 is a detailed sectional view of the oscillator assembly.

Referring now to Fig. 2, there is shown a sectional view of the oscillator. The tube 12 is shown with a first filament contact 51 and a second outer filament contact 52. Filament power is provided through a first filament line 53 and a coaxial second filament line 54 disposed centrally within the cathode element 19 and connected to the first and second filament contacts 51 and 52. An extendable grid element section 56 is disposed about the end of the grid element 18 for grid circuit tuning. Similarly, an adjustable cathode element tuning flange 57 is disposed around the cathode element 19 and shorts across to the outer shell so that the electrical length of the cathode element 19 may be altered. Similarly, an anode tuning flange 58 shorts between the anode element 21 and the outside housing 17 to provide tuning control in the output amplifier circuit.

The anode cooling water is supplied through a pair of coolant pipes 59 coupled to an external source of suitable cooling water. Direct current plate power may be supplied by connecting a high voltage lead (not shown) to an anode cooling jacket 60. A cylindrical direct current blocking capacitor 61 is connected from the plate 22 to the inner anode conductor 21 to pass high frequency current to the output line 24.

To adjust the amplitude of the neutralization signal, the length of the neutralization line 23 may be adjusted, thereby obtaining complete cancellation of the anode 22 to grid 11 capacitance. Additional amplitude control may be obtained by variation of spacing between a first neutralization electrode 62 and the inner anode conductor 21 or between a second neutralization electrode 63 and the grid element 18.

Figure 3:
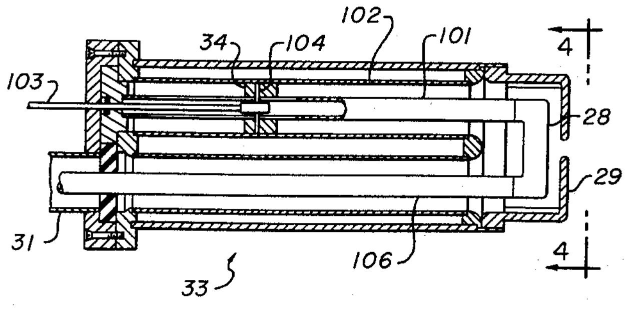
Figure 3 is a detailed sectional view of the feedback loop and amplitude control.

Referring now to Fig. 3 there is shown in section the quarter wavelength stub 33. The stub tuning element 34 is comprised of a circular shorting element between a coaxial inner conductor 101 and outer conductor 102. The inner conductor 101 is made tubular so that an adjusting bar 103 may be fitted inside. A pair of slots on opposite sides of the inner conductor 101 provides a space through which a pin 104 tying the stub tuning element 34 to the bar 103 may pass, thereby allowing for convenient external adjustment of the stub tuning element 34.

One end of the feedback loop 28 is connected to the inner conductor 101 while the opposite end is connected to the inner conductor 106 of the feedback line 31 of Fig. 1.

Since the resonant cavity within which the feedback loop 28 is disposed is generally held under a vacuum, sealing means may be included as shown in Fig. 3 to preserve the vacuum.

Figure 4:
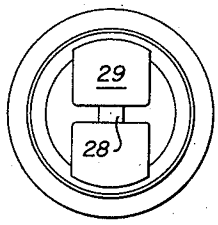
Figure 4 is a view taken along line 4—4 of Figure 3.

In Fig. 4 there is shown a view of Fig. 3 taken at line 4—4 and showing the feedback loop 28 effectively masked from the effects of electric field by the shield electrode 29.

While the invention has been disclosed with respect to a single preferred embodiment, it will be apparent to those skilled in the art that numerous variations and modifications may be made within the spirit and scope of the invention. For instance, other oscillator types may be substituted for the Colpitts type shown and tube types other than a tetrode may be utilized. Therefore, it is not intended to limit the invention except as defined in the following claims.

What is claimed is:

1. In a frequency stabilizing circuit for a linear accelerator having a resonant cavity, the combination comprising an oscillator tube having a control grid and a screen grid and an anode, a control grid element connected to said control grid, a ground electrode connected to said screen grid, a tuned anode circuit connected to said anode, an output line coupling said tuned anode circuit to said resonant cavity, a feedback loop extending within said resonant cavity, a shield extending peripherally around the portion of said feedback loop extending within said resonant cavity, a feedback electrode disposed in coupling proximity with said control grid element, a feedback line connected from a first end of said feedback loop to said feedback electrode, and a signal amplitude adjusting means connected to the second end of said feedback loop.

2. In a circuit for stabilizing an oscillator at a frequency producing the 0, 1, 0 mode in a linear accelerator of the class having a resonant cavity, the combination comprising an oscillator tube having a control electrode and an anode, a tuned anode circuit connected to said anode, a power input loop disposed in said resonant cavity of said accelerator, an output signal transmission line coupled from said anode circuit to said power input loop, a feedback loop extending within the resonant cavity of said accelerator and disposed to intercept the 0, 1, 0 mode magnetic field, a shield disposed concentrically about said feedback loop and shielding the feedback loop from electric fields, said shield being electrically discontinuous to form an open loop, a feedback line connected from a first end of said feedback loop to the control electrode in said oscillator tube, a coaxial line section having an inner conductor connected to a second end of said feedback loop and, an adjustable shorting means disposed between the inner and outer conductors of said coaxial line section whereby the electrical length of said coaxial line section may be altered.

3. In a circuit for stabilizing the frequency of an oscillator for a cavity resonator, the combination comprising an oscillator tube having a control grid and a screen grid and an anode, a tuned control grid element connected to said control grid, a source of fixed potential connected to said screen grid, a tunable anode circuit connected to said anode, a power input loop in said cavity resonator coupled to said anode circuit, a feedback loop disposed in said cavity resonator and positioned to couple with the magnetic field of an oscillator frequency corresponding to the 0, 1, 0 mode and to discriminate against the magnetic fields corresponding to other modes, a discontinuous electric field shield disposed concentrically about said feedback loop, a feedback transmission line connected from a first end of said loop to said control grid element, and a feedback signal amplitude control connected to the second end of said feedback loop.

4. Apparatus as described in claim 3 wherein said amplitude control comprises a coaxial line having a center conductor connected to the second end of said loop and having an outer conductor connected to said resonant cavity, a shorting member electrically connecting said outer conductor of said coaxial line to said inner conductor of said coaxial line, said shorting member being movable along said coaxial line whereby the distance between said feedback loop and said shorting member may be adjusted.

References Cited in the file of this patent

UNITED STATES PATENTS

| | | |
|---|---|---|
| 2,175,710 | Usselman et al. | Oct. 10, 1939 |
| 2,216,169 | George et al. | Oct. 1, 1940 |
| 2,298,075 | Tinus | Oct. 6, 1942 |
| 2,310,695 | Higgins | Feb. 9, 1943 |
| 2,444,194 | Goldstine | June 29, 1948 |
| 2,507,972 | Haeff | May 16, 1950 |
| 2,508,695 | Stone | May 23, 1950 |
| 2,627,024 | Bell | Jan. 27, 1953 |